United States Patent [19]

Sells et al.

[11] Patent Number: 4,548,285

[45] Date of Patent: Oct. 22, 1985

[54] MEASUREMENT OF SURFACE AREA FOR ELECTRODEPOSITION PLATING PROCESSES

[76] Inventors: Richard L. Sells, P.O. Box 2, Mount Liberty, Ohio 43048; Mark L. Taylor, 1156 Willard Ave., Columbus, Ohio 43212

[21] Appl. No.: 609,148

[22] Filed: May 11, 1984

[51] Int. Cl.$^4$ ............................................. G01G 23/22
[52] U.S. Cl. ............................................ 177/1; 177/25; 364/567; 73/432 R
[58] Field of Search ............... 177/1, 25, 50; 364/567, 364/568; 73/150 R, 150 A, 432 R

[56] References Cited

U.S. PATENT DOCUMENTS

| | | | |
|---|---|---|---|
| 240,678 | 4/1881 | Edison | 177/1 UX |
| 3,755,659 | 8/1973 | Bolhuis | 364/567 X |
| 3,871,489 | 3/1975 | Patigalia | 177/1 |
| 4,135,006 | 1/1979 | Readal et al. | 73/150 R |
| 4,459,783 | 7/1984 | Odell, II et al. | 177/50 X |

Primary Examiner—George H. Miller, Jr.
Attorney, Agent, or Firm—Porter, Wright, Morris & Arthur

[57] ABSTRACT

A method and apparatus for accurately calculating the plating area and current plating density for an etched circuit in connection with the electrodeposition of conducting material upon printed circuit boards used in electronic apparatus, including a system for making comparative weight determinations of a test board and calculating the circuit surface area bored thereon.

5 Claims, 3 Drawing Figures

MEASUREMENT OF SURFACE AREA FOR ELECTRODEPOSITION PLATING PROCESSES

I. FIELD OF THE INVENTION

This invention relates to methods and apparatus for accurately calculating the plating area and current plating density for an etched circuit in connection with the electrodeposition of conducting material upon printed circuit boards used in electronic apparatus.

II. BACKGROUND OF THE INVENTION

Many present-day printed circuit boards are double-side-plated, thru-hole circuit boards, typically formed from fiberglass reinforced resin panels having conductive circuit patterns etched on both sides of the card. Holes in the circuit card are a mechanical mount for electronic components and a "feed thru" for electrical conduction in etched circuits on the "front" side of the board to etched circuits on the "back" side. Electrical conduction occurs between the "front" and "back" etched patterns of the circuit board, because the inside circumference of the holes is plated with a conductive metal such as copper.

In the fabrication of such a circuit board, card holes are drilled and burrs are removed. Then, the panels and thru-holes are processed by chemical application of a thin layer of "electroless" copper. This deposition provides an initial conduction path in the hole walls, which with the board itself, will be later electroplated.

It is impractical to provide a thickness of copper on the hole walls by the chemical process sufficient for a mechanically and electrically stable "front" to "back" connection. The thin, electroless copper conductive layer is next plated by electrodeposition to build up a layer of copper in the hole walls. Before electroplating, circuit panels are typically coated with a plating resist compound which covers the circuit panel, except for the etched circuit pattern, and the holes. Photographic imaging of a circuit pattern on a light sensitive resist material, which after development exposes the circuit pattern to be subsequently plated and etched, is one means by which this is done.

When the circuit panels are electroplated, the area plated consists of (1) the circuit pattern, (2) the walls of the holes and (3) usually a "robber area" around the perimeter of the circuit pattern. These areas are plated with copper by electrodeposition, and a second electroplating operation deposits a solder coating on the circuit pattern and hole walls. The solder is also an etch resist in latter stages of fabrication. Other materials such as gold and silver may also be plated on the circuit board.

In electroplating, the thickness of the plated material deposited is proportional to the product of (1) electric current per unit area and (2) time. Given a predetermined plating current, the thickness of the plating material deposited per unit time will be inversely proportional to the surface area plated.

It is important that an exact quantity and quality of deposit be obtained on the surface of the circuit pattern and hole walls, because (1) too little a deposit results in poor mechanical and electrical characteristics for the plated thru-holes; (2) overplating may close down the hole diameter, resulting in an inability to insert components into the holes; and (3) plating at too high or too low a current density will result in a dull or burned deposit. An occurrence of any of the foregoing may result in a quality control reject. Similarly, expensive plating materials such as gold or silver may be used, and accurate control of plating parameters, as well as the avoidance of reject boards, is a critical factor in manufacturing expense.

Thus, there is a need accurately to compute the entire area of an electronic circuit board to be plated so that proportional parameters of plating current and time can be accurately determined for the plating operation for a given circuit board. Because circuit trace geometries including hole wall areas are complex, even in a simple circuit pattern, accurate mathematical computation of the surface are to be plated is difficult.

Optical techniques are used in the prior art. In one commercial device, a photographic film having the image of the circuit traces is placed between a light source and photosensors. The amount of light transmitted through the film is measured and interpreted to estimate the area to be plated. This process is inaccurate because of the inability to provide a uniform light source and optical sensing system over the entire area of the board. Thus, the light measured for a given photo image is a function of its position with respect to the optic system; and refraction, reflection and absorption characteristics may distort the light transmission. Therefore, a same surface area may yield different measured values across the area of the optical system. Optical estimation of the area of a surface trace pattern may also neglect the area gained by the hole walls, and area lost by the "faces" of the cylinders created by the holes, which in many cases substantially contributes to the overall area to be plated.

Other means to determine the area of a circuit to be plated include educated guessing, repetitive tests of different current values and current measurements in the electroplating bath dependent on a probe measurement of a "test area" of known surface area in the plating bath with a sample part to be plated. With respect to the latter, the current density of current passing through the sample panels and probe is expected to yield the plating area per part. Because of field effects, the measured value of current for a probe device depends on probe geometry as well as its total surface area and position in the electroplating bath. Consequently, computed areas vary with probe geometry and position. Additionally, such an empirical method may require repeated tests, resulting in production delay and wasted reject panels.

III. OBJECTS OF THE INVENTION

It is an object of the invention to provide a method and apparatus to determine with a high degree of accuracy the total surface area of a printed circuit board which is to be plated and to project a proper current density and current setting for the electroplating process so that a desired predetermined plating thickness for the traces etched and hole walls may be achieved by the electroplating process on a printed circuit board.

It is a further object to determine plating current density for a printed circuit electrodeposition process, to reduce experimental conduction runs, to increase production rates, and to optimize plating processes by determining a proper plating current to minimize the duration of plating and to avoid problems and quality control reject resulting from underplating and overplating.

In this manner, it is an object to provide a useful apparatus which provides an efficient mechanism for accurately predicting an optimum current density at which materials can be electroplated upon circuit designs of printed electronic circuit boards.

IV. DESCRIPTION OF THE DRAWINGS

These and other objects of the invention will be evident from the following description of the preferred embodiment in conjunction with the drawings in which.

V. DESCRIPTION OF THE PREFERRED EMBODIMENT

In a most simple application of the invention, an undrilled copper-clad fiberglass panel of the type conventionally used in printed electronic circuits is laminated and imaged with a plating resist composition to define the circuit segments which are ultimately to be plated. This panel is then etched to remove copper film from the circuit area. This area etched is exactly the same as the area to be plated with the exceptions (1) that "faces" of the "holes" are etched which would not be plated and (2) hole walls which are to be plated are not etched. The copper etched away from the surface is of a known surface area per unit mass. Therefore, the weight difference of the same circuit board between the weight before etching and the weight after etching is proportional to the area to be plated, except for contributions and deductions due to the thru-holes. By determining the mass of a board (1) prior to etching, (2) the mass after etching, and (3) the number and diameter of holes, the (4) exact surface area of the board to be plated, and consequently, (5) plating current density, and (6) time for a (7) given plating thickness can be determined.

Figure 1:
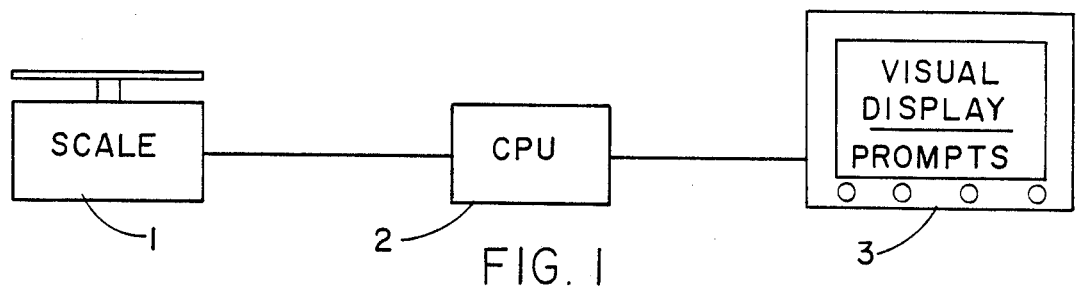
FIG. 1 is a block diagram of an apparatus of the invention.

FIG. 1 shows a typical apparatus configuration for a plating area/current density calculator in accordance with the invention. In FIG. 1 a scale or other weight sensing means (1) is operatively interconnected to a central processing unit (CPU) (2) which receives an input signal from the weight sensing means when, in accordance with the method of the invention, the weight of a board is required to be determined. After two respective weights and hole data for the board are entered into the CPU, which may be done in accordance with prompt signals appearing on the visual display (3), the CPU will determine approximate plating parameters in accordance with the method hereinafter described and provide an appropriate display thereof. The CPU may be a programmed digital computer or other calculating means, and the visual display may consist of a video screen, printer or the like. The following are examples of the method used for the determination of current plating density for a given circuit panel.

Figure 2:
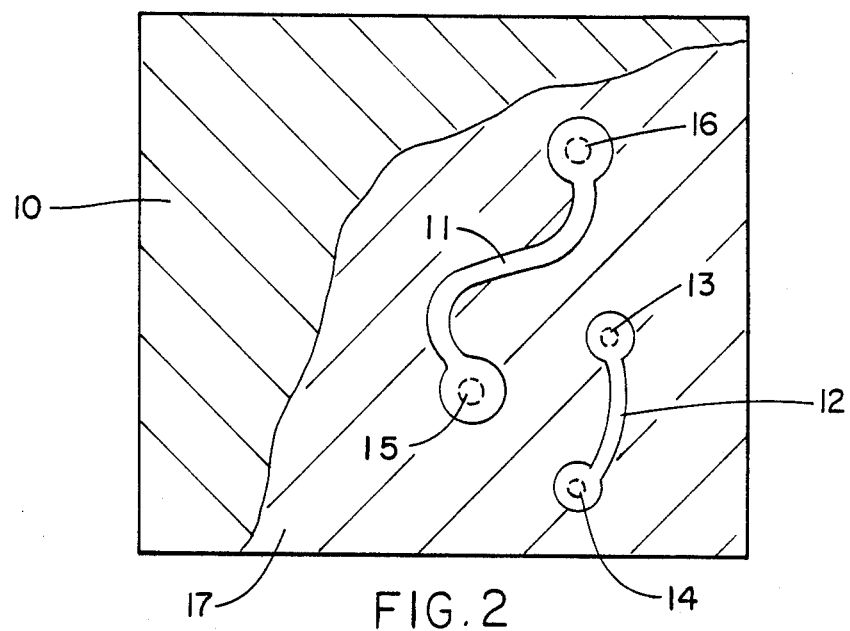
FIG. 2 depicts a section of a printed circuit board with which the method and apparatus of the invention is useful.

In illustrating the method, FIG. 2 shows a segment of a printed circuit panel 10 having a predetermined circuit pattern described thereon 11 and 12, including areas for part mounting holes 13, 14, 15 and 16. In a cross-section of the board, copper foil 17 is laminated to the resin board on one or both sides. In the method of the invention, an etch or plating resist material is applied over the surface of the foil in all areas of the board, except for the circuit defining patterns 11 and 12. The board is placed in an etch bath and patterns 11 and 12 in the foil laminate are fully etched away from the board.

Figure 3:
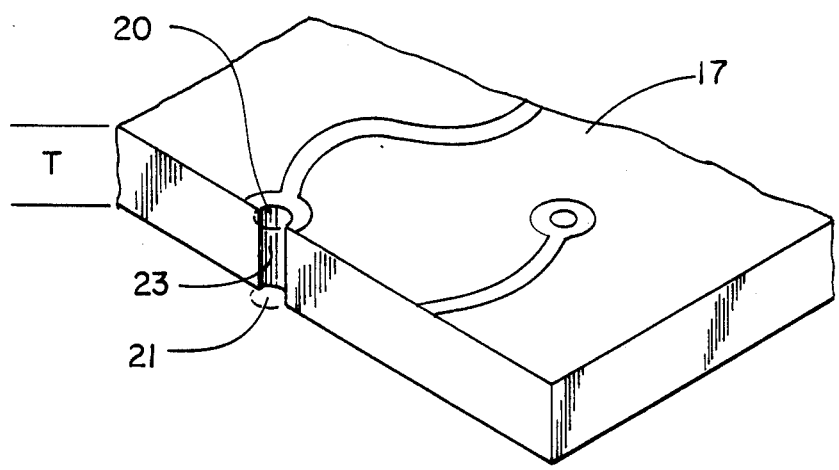
FIG. 3 represents a perspective view of the board, showing cross-sectional elements useful in the understanding of the invention.

FIG. 3 shows a detail of board holes showing the board thickness "T", a front 20 and opposite 21 hole face and a hole wall 23 comprising the inside cylinder of the hole.

Conventional aqueous or solvent resists and etching solutions as are well known in the printed circuit art may be used in connection with the invention. Typical useful resists include DuPont Riston ® and Dynachem Laminar ®, and useful etchants include ammonical etchant and peroxide sulfuric etch solutions.

EXAMPLE I

A fiberglass panel is laminated on both sides with a copper foil having a uniform thickness and density such that one square foot of panel area on either side corresponds to one ounce of copper foil laminate. This panel is a "test panel" and is not drilled. The test panel is negatively imaged with etch resist such that all areas intended in a finished panel to be plated have copper exposed. The test panel is then weighed and a first panel weight is recorded.

The exposed copper circuit area is then etched away; the test panel is again weighed and the second weight is recorded. Because the copper foil has a constant, known weight per square foot, the weight of the copper etched away—corresponding to the final circuit—is proportional to the overall surface area of the circuit pattern, except for the hole faces and walls. As noted, the "hole face" is the circular surface area occupied by the entrance and exit points of a hole and the "hole wall" is the surface area occupied by the interior cylindrical "wall" of the hole through the thickness of the board. The area determination includes the following steps:

Step One

The surface area (SA) etched corresponding to the area of foil circuit pattern, including hole faces, equals the initial weight (IW) of the panel less the final weight (FW) of the panel times surface area per unit weight (K), i.e., SA=(IW−FW)XK. In this instance, because the surface area per unit mass of the copper foil is one square foot per ounce, the overall circuit area is determined by the weight difference times the constant K, the unit surface area per unit weight.

Step Two

The adjustment to the calculation of area due to the contribution to total plating area for a single hole is determined according to the following formula:

$$HA = \left( \pi dT - \frac{\pi d^2}{2} \right) \div 144$$

where HA=hole area (loss of face area plus gain of cylinder area) (foot$^2$); $\pi$=3.14159; d=diameter of hole (inches); T=thickness of panel material (inches).

Step Three

A panel may contain several parts and each part may have several holes of different sizes. These are readily determinable values conventionally stated in board specifications; thus, for all holes of a single size on a circuit board panel, the total hole barrel area is the sum of:

$$THA_1 = \left( \pi d_1 T - \frac{\pi d_1^2}{2} \right) \frac{(N_1 P)}{144}$$

repeated for each hole of a different size, where $THA_1$ = hole area contribution for one hole size (foot$^2$); $d_1$ = hole diameter for first hole size (inch); $N_1$ = number of holes of diameter $d_1$ on an individual unit circuit board; and P = number of individual unit circuit boards on a panel to be electroplated.

Step Four

The area represented by the edge of the panel (EA) is EA (foot$^2$) = ([major axis of panel (inches) + minor axis of panel (inches)] (2T ÷ 144).

Step Five

The total area (A) to be plated is thus A (ft$^2$) = $THA_n$ = EA + SA + $THA_1$ + $THA_2$ + ....

Step Six

The current required (CHAMPS) to plate the total circuit area A (foot$^2$) in amps at a particular density in amps/foot$^2$ is CHAMPS (amps) = A (foot$^2$) × D (amps/foot$^2$), where D is the given current density in amps per square feet used in the plating operation.

EXAMPLE II

In the plating process for single-sided panels, the hole walls are not plated. In this example, the panel is laminated on only one side with copper foil of a thickness such that one square foot of copper corresponds to two ounces. In this example, all area "contributions" from the panel holes are negative because hole faces to be drilled are of consideration only on one side of the test panel. The edge of the panel is not plated in a single-sided process. In this example: SA becomes SSA, thus SSA (foot$^2$) = (IW − FW) × foot$^2$ per unit weight; HA becomes SHA; $THA_1$ becomes $STHA_1$; and the total area to be plated (A) becomes (AS), as follows: AS = -SSA + $STHA_1$ + $STHA_2$ + ... + $STHA_n$. The current required per panel, S CHAMPS = AS × D.

EXAMPLE III

A. A program listed in a BASIC programming language adaptable for use by a general purpose digital computer in accordance with the invention is set forth below:

```
20    DIM NH(15)
30    DIM HS(15)
40    THA = 0.
50    PRINT "PLATED THRU HOLE CURRENT
      CALCULATION"
60    PRINT " "
70    PRINT " "
80    PRINT " "
90    INPUT "TYPE YOUR INITIALS ":O$
100   INPUT "TYPE JOB NUMBER ":N$
105   P$ = "J" +N$
110   INPUT "TYPE CUSTOMER NAME ":C$
120   INPUT "TYPE PART NUMBER":P$
130   INPUT "TYPE REVISION LEVEL":R$
140   INPUT "TYPE DATE ":A$
150   INPUT "ENTER MATERIAL THICKNESS":T
160   INPUT "ENTER PANEL'S MINOR AXIS":X
165   INPUT "ENTER PANEL'S MAJOR AXIS":Y
```

```
180   INPUT "ENTER NUMBER OF PARTS ON PANEL":N
190   INPUT "ENTER NUMBER OF HOLE SIZES":J
192   Z = J + 15
195   IF J = 0 THEN GOTO 310
200   PRINT "   ENTER NUMBER OF HOLES FIRST"
210   PRINT "   THEN ENTER HOLE DIAMETER"
220   PRINT "   DO THIS FOR EACH HOLE SIZE"
230   FOR I = I TO J
240   PRINT " "
250   PRINT " "
260   INPUT "NUMBER OF HOLES = ":NH(I)
270   INPUT "DIAMETER = ":HS(I)
280   NEXT I
290   PRINT " "
300   PRINT " "
310   INPUT "ENTER INITIAL WEIGHT IN GRAMS":IW
320   INPUT "ENTER FINAL WEIGHT IN GRAMS":FW
325   IF J = 0 THEN GOTO 370
330   FOR I = I TO J
340   HA = (3.1459 * T * NH(I) * HS(I) − 3.14159 * NH(I) *
      HS(I) ∧ 2 / 2) / 144
350   THA = THA +HA
360   NEXT I
370   SA = (IW − FW) / 28.3495
380   EA = 2 * (X + Y) * T / 144
390   CHAMPS = N * THA + SA + EA
391   GOSOB 400
392   PR# 1
393   GOSOB 610
394   GOTO 750
400   D$ = CHR$ (4)
402   PRINT D$:"OPEN":F$
404   PRINT D$:"WRITE":F$
405   GOSOB 409
406   PRINT D$:"CLOSE":F$
407   GOTO 392
409   PRINT Z
410   PRINT "PLATED THRU HOLE CURRENT
      CALCULATION"
420   PRINT " "
430   PRINT "OPERATOR":O$
440   PRINT "JOB NUMBER":N$
450   PRINT "CUSTOMER NAME":C$
460   PRINT "PART NUMBER":P$
470   PRINT "REVISION LEVEL":R$
480   PRINT "DATE":A$
490   PRINT "MATERIAL THICKNESS":11
500   PRINT "PANEL SIZE "X" BY "Y
510   PRINT "NUMBER OF PARTS ON PANEL":N
520   PRINT "NUMBER OF HOLE SIZES ":J
525   IF J = 0 THEN GOTO 560
530   FOR I = I TO J
540   PRINT "NUMBER OF HOLES= "NH(I)"
      DIAMETER= "HS(I)
550   NEXT I
560   PRINT "INITIAL WEIGHT = ":IW
570   PRINT "FINAL WEIGHT= ":FW
590   PRINT "FOR 10 ASF "10 * CHAMPS" AMPS
      REQUIRED PER PANEL"
605   RETURN
610   PRINT "JOB NUMBER = ":N$
620   PRINT "CUSTOMER NAME = ":C$
630   PRINT "PART NUMBER = ":P$
640   PRINT "REVISION LEVEL = ":R$
650   PRINT "NUMBER OF PARTS ON PANEL = ":N
660   PRINT "PANEL SIZE = "X" BY "Y
670   FOR I = 1 TO 10
680   PRINT "FOR "1 * 10" ASF" INT(1 * 10 *
      CHAMPS)" AMPS REQUIRED PER PANEL"
690   NEXT I
/00   PRINT " "
/10   PRINT "BY "U$" "A$
/20   RETURN
/50   PRINT CHR$ (12)
/60   PR# 0
/70   STOP
/80   GOTO 40
```

B. A sample run of the program set forth above using the apparatus of the type shown in FIG. 1 is illustrated below:

```
PLATED THRU HOLE CURRENT CALCULATION

TYPE YOUR INITIALS MI
TYPE JOB NUMBER 0001
TYPE CUSTOMER NAME ALPHA ALPHA TANGO
TYPE PART NUMBER MG11
TYPE REVISION LEVEL NONE

ENTER MATERIAL THICKNESS .062
ENTER PANEL'S MINOR AXIS 12
ENTER PANEL'S MAJOR AXIS 24
ENTER NUMBER OF PARTS ON PANEL 8
ENTER NUMBER OF HOLE SIZES 6
    ENTER NUMBER OF HOLES FIRST
    THEN ENTER HOLE DIAMETER
    DO THIS FOR EACH HOLE SIZE

NUMBER OF HOLES = 40
DIAMETER = .038

NUMBER OF HOLES = 563
DIAMETER = .042

NUMBER OF HOLES = 24
DIAMETER = .049

NUMBER OF HOLES = 12
DIAMETER = .058

NUMBER OF HOLES = 2
DIAMETER = .070

NUMBER OF HOLES = 2
DIAMETER = .131

ENTER INITIAL WEIGHT IN GRAMS 635.4
ENTER FINAL WEIGHT IN GRAMS 598.4
JOB NUMBER = 0001
CUSTOMER NAME = ALPHA ALPHA TANGO
PART NUMBER = MG11
REVISION LEVEL = NONE
NUMBER OF PARTS ON PANEL = 8
PANEL SIZE = 12 BY 24
FOR 10 ASF 15 AMPS REQUIRED PER PANEL
FOR 20 ASF 30 AMPS REQUIRED PER PANEL
FOR 30 ASF 45 AMPS REQUIRED PER PANEL
FOR 40 ASF 61 AMPS REQUIRED PER PANEL
FOR 50 ASF 76 AMPS REQUIRED PER PANEL
FOR 60 ASF 91 AMPS REQUIRED PER PANEL
FOR 70 ASF 107 AMPS REQUIRED PER PANEL
FOR 80 ASF 122 AMPS REQUIRED PER PANEL
FOR 100 ASF 152 AMPS REQUIRED PER PANEL
```

C. Such program results and calculation data may be conveniently stored in a memory means for convenient access.

EXAMPLE IV

The feasibility for commercial use of the method and combination of apparatus described herein was evaluated over a period of time during which the system of the invention and conventional means were utilized to calculate the plating area and current density for the same board and/or panel. In the comparison, it was determined that the system of the invention would provide a regularly accurate and repeatable result upon which commercial production could be reliably planned.

Application of the system, method and apparatus of the invention may be adapted to a sandwich, multi-layer board, single-sided board, double-sided board and other types of boards into suitable modifications to the process steps as should be evident to those of skill in the art given the foregoing description.

It is evident that different types of scales, mass and/or weight determining means as well as comparing means may be utilized in conjunction with the invention, given the foregoing illustrative description.

What is claimed is:

1. A method for accurately calculating the plating area for an etched electronic circuit board in connection with the electrodeposition of materials upon the circuit etchings of said boards, consisting of:
   (a) providing a first weight measurement for the board in a first condition in which the board is coated with a material having a known unit weight per unit surface area;
   (b) providing a second weight measurement for the board in a second condition in which the area of the material coating of the board corresponding to the area of the electronic circuit to have a material electrodeposited therein, is removed from the board;
   (c) comparing said first and second weight measurements and determining the surface of the electronic circuit according to the formula:

$$(\text{First Weight} - \text{Second Weight}) \times \frac{(\text{surface area})}{\text{coating weight}} \text{ unit}$$

2. The method of claim 1 in which the circuit board includes part mounting holes which are to have a material electrodeposited therein and the method includes the additional steps of subtracting from the Circuit Surface Area the following value:

$$HA = \left(\pi d T - \frac{\pi d^2}{2}\right) \cdot N$$

where HA=hole area contribution for one hole size; d=diameter of hole; T=thickness of the board; N=number of holes of diameter d.

3. The method of claim 2 in which the board includes a plurality of part mounting holes of different sizes and the value determined by the formula:

$$HA = \left(\pi d T - \frac{\pi d^2}{2}\right) \cdot N$$

is determined for the hole area of all holes of each hole of a given size and the sum of the hole areas for all part mounting holes is subtracted from the Circuit Surface Area.

4. An apparatus to determine with a high degree of accuracy, the total surface area of a copper-clad printed circuit board which is to be plated, for use in projecting a current density and current setting for the electroplating process, so that a desired predetermined plating thickness for the circuit etchings and hole walls may be achieved by the electroplating process on the board comprising:
   (a) a first means for measuring and recording a first and second weight of a predetermined circuit board panel, said first weight being an initial board weight and said second weight consisting of the weight of the circuit board panel after the copper-clad area of the panel corresponding to the circuit of the panel is etched therefrom; and
   (b) means for comparing said first and second weights and determining the circuit area of the panel etched from the board by multiplying the difference between the first and second weights times the single unit area per unit weight of the copper cladding etched from the board.

5. The apparatus of claim 4 including further means for calculating the positive and negative contribution of part mounting holes to the overall surface area of the circuit to be plated, in which a further means is provided to subtract from the result provided by the second means the value THA where:

$$THA = \sum_{H=1}^{Q} \left( \pi d_H T - \frac{\pi d_H^2}{2} \right) \cdot N_H$$

where $d_H$=diameter of hole of first size; $N_H$=number of holes of first size; T=thickness of panel; Q is the number of different size holes; until holes of all sizes are accounted for in the summation.

* * * * *